United States Patent [19]

Sporck

[11] Patent Number: 5,796,265

[45] Date of Patent: Aug. 18, 1998

[54] METHOD FOR METAL DELAY TESTING IN SEMICONDUCTOR DEVICES

[75] Inventor: Nicholas Sporck, Saratoga, Calif.

[73] Assignee: LSI Logic Corporation, Milpitas, Calif.

[21] Appl. No.: 608,609

[22] Filed: Feb. 29, 1996

[51] Int. Cl.[6] .................................................. G01R 31/02
[52] U.S. Cl. .................................................. 324/763
[58] Field of Search .................... 324/763, 73.1, 324/76.1; 326/16, 63, 80, 65

[56] References Cited

U.S. PATENT DOCUMENTS

| | | | |
|---|---|---|---|
| 4,587,480 | 5/1986 | Zasio | 324/73 |
| 4,712,061 | 12/1987 | Lach | 324/76.82 |
| 5,068,547 | 11/1991 | Gascoyne | 326/16 |
| 5,103,120 | 4/1992 | Suzuki et al. | 326/65 |
| 5,148,263 | 9/1992 | Hamai | 257/758 |
| 5,495,183 | 2/1996 | Suzuki et al. | 326/63 |
| 5,521,530 | 5/1996 | Yao et al. | 326/80 |

*Primary Examiner*—Ernest F. Karlsen
*Assistant Examiner*—Anh Phung
*Attorney, Agent, or Firm*—Fitch, Even, Tabin & Flannery

[57] ABSTRACT

A semiconductor device is provided having a circuit for measuring a propagation delay related to metal layers formed on the device. In one embodiment, the circuit includes a first bond pad connected to an input of a first signal path, the first signal path including a first plurality of serially connected logic gates wherein the connection between each logic gate of the first plurality is formed on a first metal layer and a second bond pad connected to an output of a second signal path, the second signal path including a second plurality of serially connected logic gates wherein the connection between each logic gate of the second plurality is formed on a second metal layer, the second signal path being in electrical communication with the first signal path.

6 Claims, 3 Drawing Sheets

METHOD FOR METAL DELAY TESTING IN SEMICONDUCTOR DEVICES

BACKGROUND OF THE INVENTION

This invention relates generally to the field of testing semiconductor devices, and more particularly, to testing the propagation delay due to metal layers on the device.

Semiconductor devices, such as integrated circuits, must be thoroughly tested before they are shipped from the manufacturer to consumer. This is important not only for process control considerations, but also for verifying that each device shipped to the consumer meets its published performance specifications. One parameter which must be tested is the propagation delay of the various circuit paths on the chip. The performance of the overall integrated circuit is closely related to these delays. In general, the larger the delays, the slower the chip.

Propagation delays can be divided into two general categories. The first category concerns the delays related to the transistors fabricated on the integrated circuit itself. The second category of propagation delays is related to the propagation delay due to the metal layers and structures connecting the devices on the chip. Until recently, propagation delays due to the metal layers on the chip were largely ignored because of their relative insignificance compared to the propagation delays of the transistors. However, transistor performance has recently improved to the point that the metal delays are now often as important, if not more so, than the transistor delays. Therefore, there is a need in the art for methods to accurately measure the propagation delay due to the metal layers on the chip, i.e., the metalization.

Several methods are commonly used to measure propagation delays. However, none of these methods is completely satisfactory to determine the delay caused by metalization. For example, one method is to incorporate a special structure, or circuit, into each design which allows accurate measurement of the delays of N and P channel transistors. This technique has two basic flaws. First, it does not allow direct measurement of the delays caused by metalization. Second, random delay faults are unpredictable unless they occur in the special circuit itself.

Another method used to determine propagation delays is the "at-speed" test. In this test, the system environment of the chip is duplicated on sophisticated testing equipment. In theory, this method has the ability to detect the delays of most circuit paths, including metal paths, on the chip. However, this method requires very expensive test equipment and presents significant difficulties in developing and analyzing high quality test patterns.

Still another technique is known as critical path testing. In this test, certain circuit paths critical to the operation of the chip are designated as "representative" and are used for testing propagation delays. If the representative paths are determined to be within specification, then it is assumed that all other paths on the chip are also within specification. However, there are several problems with this test method as well. For example, not all paths are testable from the I/O pins of the chip. Also, the inaccuracy of the test equipment makes it difficult in some cases to make good measurements. Further, this method also lacks the ability to detect random delay faults.

It is therefore an object of the invention to provide a method and apparatus for overcoming the above referenced problems, as well as provide further advantages over other techniques currently used in the art which will become apparent in view of the following disclosure.

SUMMARY OF THE INVENTION

A semiconductor device is provided having a circuit for measuring a propagation delay related to metal layers formed on the device. In one embodiment, the circuit comprises a first bond pad connected to an input of a first signal path, the first signal path comprising a first plurality of serially connected logic gates wherein the connection between each logic gate of the first plurality is formed on a first metal layer and a second bond pad connected to an output of a second signal path, the second signal path comprising a second plurality of serially connected logic gates wherein the connection between each logic gate of the second plurality is formed on a second metal layer, the second signal path being in electrical communication with the first signal path.

According to another embodiment of the invention, a method for measuring a propagation delay related to metal layers formed on a semiconductor device having a first signal path including a first plurality of logic gates which are serially connected by a first metal layer and a second signal path in electrical communication with the first signal path and including a second plurality of logic gates which are serially connected by a second metal layer. In one embodiment, the method comprises providing a signal to an input of the first signal path; detecting the signal at an output of the second signal path; determining a time difference between when the signal is provided and detected; and subtracting the delay due to the logic gates from the time difference.

BRIEF DESCRIPTION OF THE DRAWINGS

For a more complete understanding of the invention and for further advantages thereof, reference is made to the following Detailed Description taken in conjunction with the accompanying drawings, in which.

It is noted, however, that the appended drawings illustrate only typical embodiments of this invention and are therefore not to be considered limiting of its scope, for the invention may admit to other equally effective embodiments.

DETAILED DESCRIPTION OF THE EMBODIMENTS OF THE INVENTION

Figure 1:
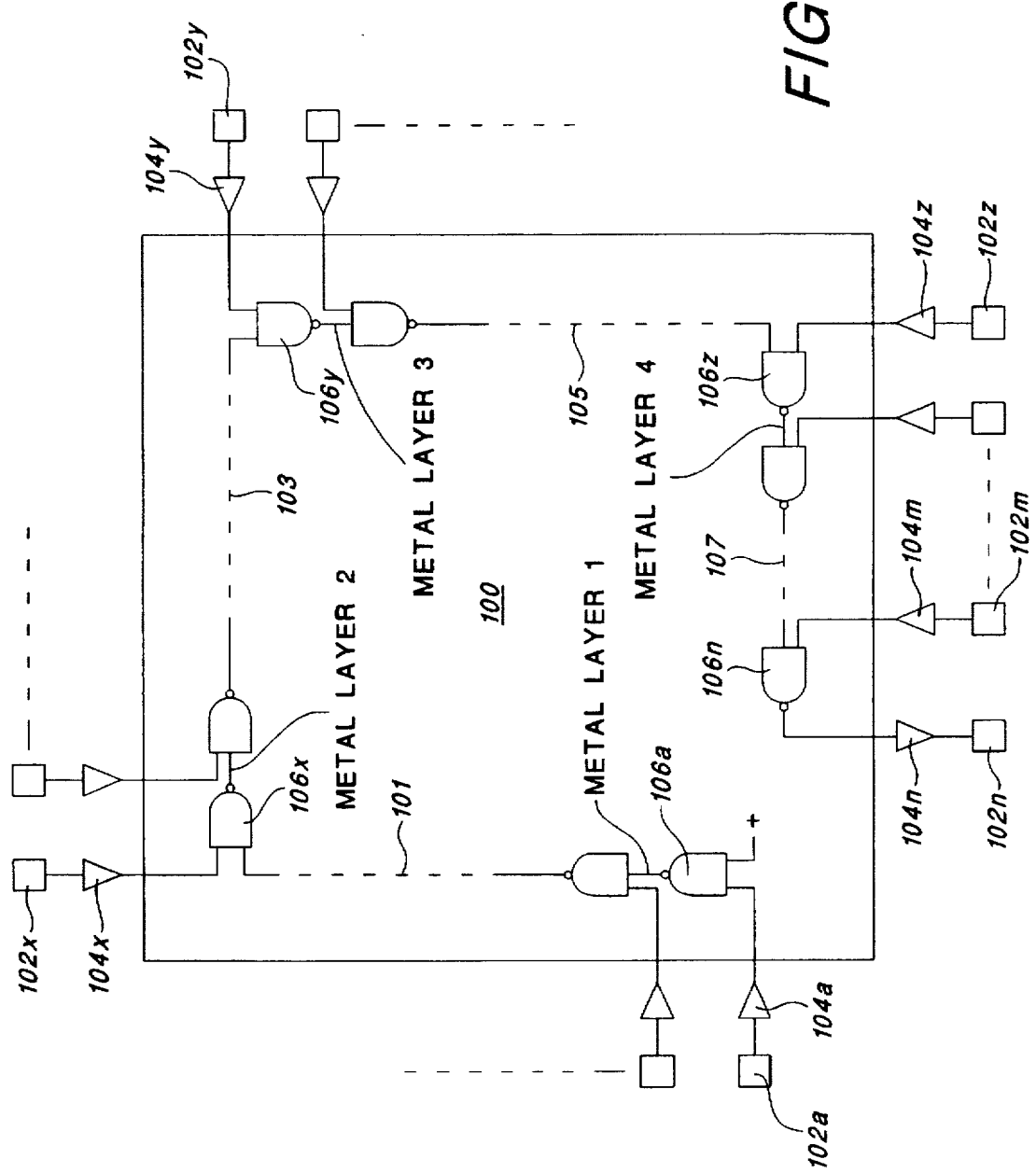
FIG. 1 is a schematic diagram of an integrated circuit according to an embodiment of the invention.

Referring now to FIG. 1, there is provided a semiconductor device 100 having a circuit for measuring a propagation delay due to the metal layers formed on the device 100. In this embodiment, the circuit comprises a plurality of serially connected logic gates, in this case, NAND gates 106a–106n formed around the perimeter of the device 100. Of course, it is to be understood that the invention is not limited to NAND gates. In other embodiments of the invention, NOR gates, inverters, and numerous other types of gates common in the art are used. However, for purposes of illustration, it is sufficient to describe the NAND gate embodiment.

Referring again to FIG. 1, one input of each NAND gate 106a–106n is connected to a corresponding bond pad 102a–102n of the chip 100 via input buffers 104a–104n. This structure is referred to as a parametric NAND tree. Of course, it is understood that in alternate embodiments of the invention, it is not necessary that each logic gate be connected to a bond pad of the chip. However, in the illustrated embodiments, more options for testing propagation delays are available because this embodiment provides bond pad access to any gate in the NAND tree.

The NAND tree begins with logic gate 106a which has one input connected to a first bond pad 102a and a second input connected to a voltage source. The NAND tree ends with logic gate 106n which is connected to bond pad 102n via output buffer 104n. In the embodiment shown, the NAND tree comprises four signal paths 101, 103, 105 and 107. Each signal path is routed in a different metal layer. For example, the metal layers providing the connections between gates 106a–106x are routed in metal layer 1. The connections between gates 106x-106y are routed in metal layer 2. The connections between gates 106y-106z are routed in metal layer 3. And the connections between gates 106z and 106n are routed in metal layer 4.

This embodiment allows for the determination of the propagation delay due to each metal layer by the following method. A signal is provided at bond pad 102a which will serve as an input to NAND gate 106a. This signal travels through the parametric NAND tree and is eventually output at bond pad 102n. The time delay between providing the signal at bond pad 102a and detecting the signal at bond pad 102n is the total propagation delay for the parametric NAND tree ("$Pd_{TOTAL}$"). This delay is equal to:

$Pd_{TOTAL}$ = (delay of all logic gates) +

(metal 1 routing delay) + (metal 2 routing delay) +

(metal 3 routing delay) + (metal 4 routing delay).

Having determined the total delay of the parametric NAND tree, the delay due to circuit paths 103, 105 and 107 is now determined. An input signal is provided at bond pad 102x, and the propagation delay is again measured at pad 102n. This is the propagation delay for circuit paths 103, 105 and 107. This delay is represented by the term "$Pd_{3-7}$" and is equal to:

$Pd_{3-7}$ = (delay of all logic gates) –

(delay of logic gates in circuit path 101) + (metal 2 routing delay) +

(metal 3 routing delay) + (metal 4 routing delay).

Subtracting the propagation delay due to circuit paths 103, 105 and 107 from the total parametric NAND tree delay yields the propagation delay due to circuit path 101. This is seen in the following equation:

$Pd_{TOTAL}$ – $Pd_{3-7}$ = (delay of all logic gates in circuit path 101) + (metal 1 routing delay).

Figure 2:
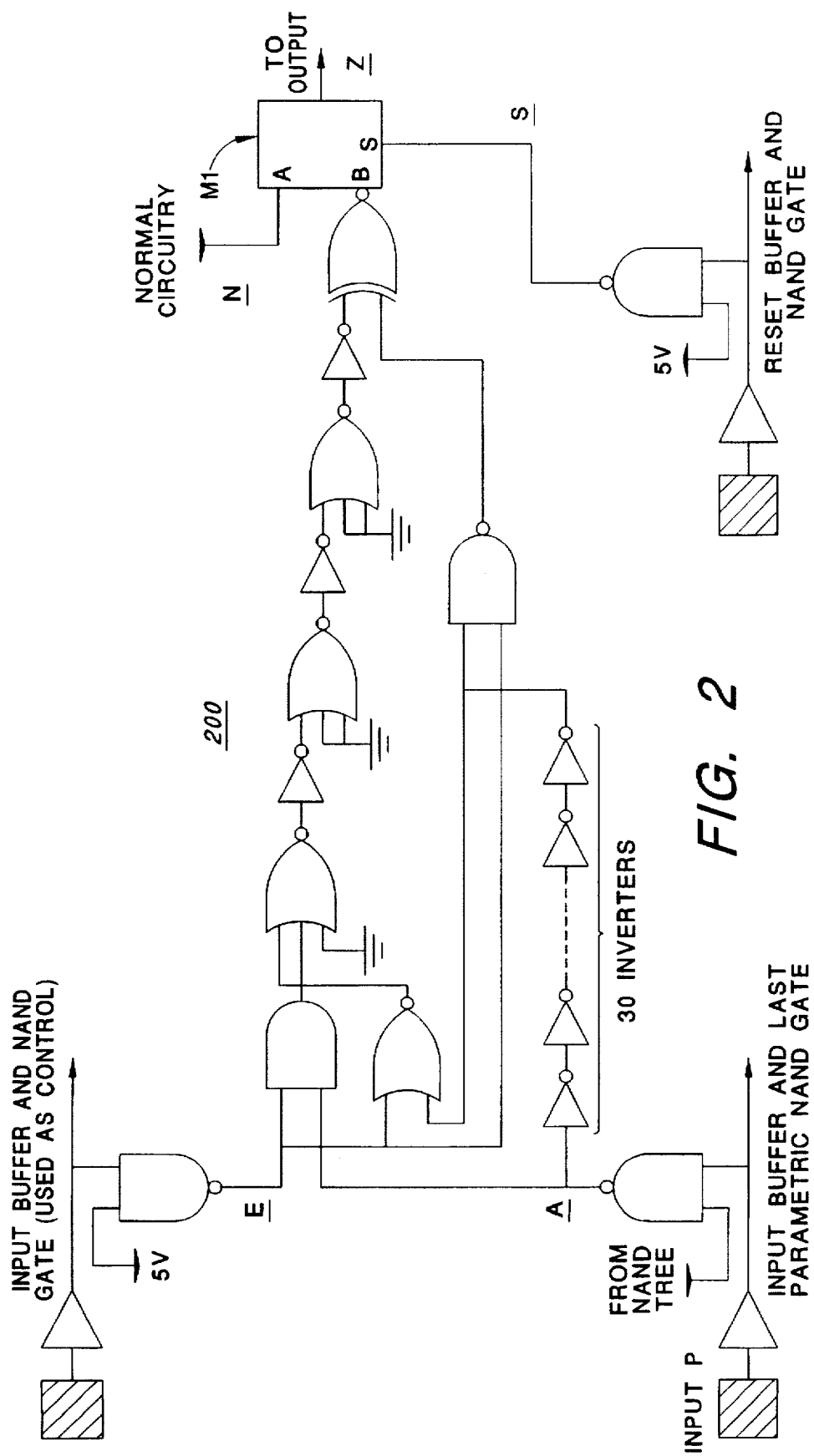
FIG. 2 is a schematic diagram of a circuit useful according to a further embodiment of the invention.

From the above equation, it is apparent that the metal 1 routing delay is determinable if the intrinsic delay of a NAND gate is known. Methods for determining the intrinsic delay of logic gates are known to those of skill in the art. For example, in one method, special test circuits are included in the integrated circuit itself. One useful circuit for determining the intrinsic delay of logic gates is disclosed in U.S. Pat. No. 5,068,547 entitled "Process Monitor Circuit," issued to William H. Gascoyne, and is incorporated herein by reference. An example of a suitable circuit for determining the intrinsic delay of the NAND gates is shown in FIG. 2. When an input signal P is introduced at input 202, the circuit is made to oscillate. The period of the oscillations measured at the output of the circuit 200 is then used to determine the intrinsic delay of the logic gates in the circuit by methods known to those with skill in the art such as those described in the above-referenced patent. The propagation delay due to metal layer 1 is then determined by subtracting the delay due to the logic gates in circuit path 101 in the above equation.

Referring again to FIG. 1, the propagation delay due to metal layer 2 is determined in a similar fashion as that of metal layer 1. An input signal is provided at bond pad 102y. The propagation delay time $Pd_{5-7}$ required for the signal provided at bond pad 102y to travel through circuit paths 105 and 107 is measured as before. This propagation delay time is equal to:

$Pd_{5-7}$ = (delay of all logic gates) –

(delay of logic gates in circuit path 101) –

(delay of logic gates in circuit path 103) – (metal 1 delay) –

(metal 2 delay) + (metal 3 delay) + (metal 4 delay).

As discussed above, the delay due to the logic gates in each of the circuit paths and the propagation delay due to metal 1 are known. Therefore, subtracting the propagation delay through circuit paths 105 and 107 from the total propagation delay yields the propagation delay due to metal layer 2.

By providing input signals at 102z, a similar analysis is performed to determine the delays of metal 3 and metal 4.

Figure 3:
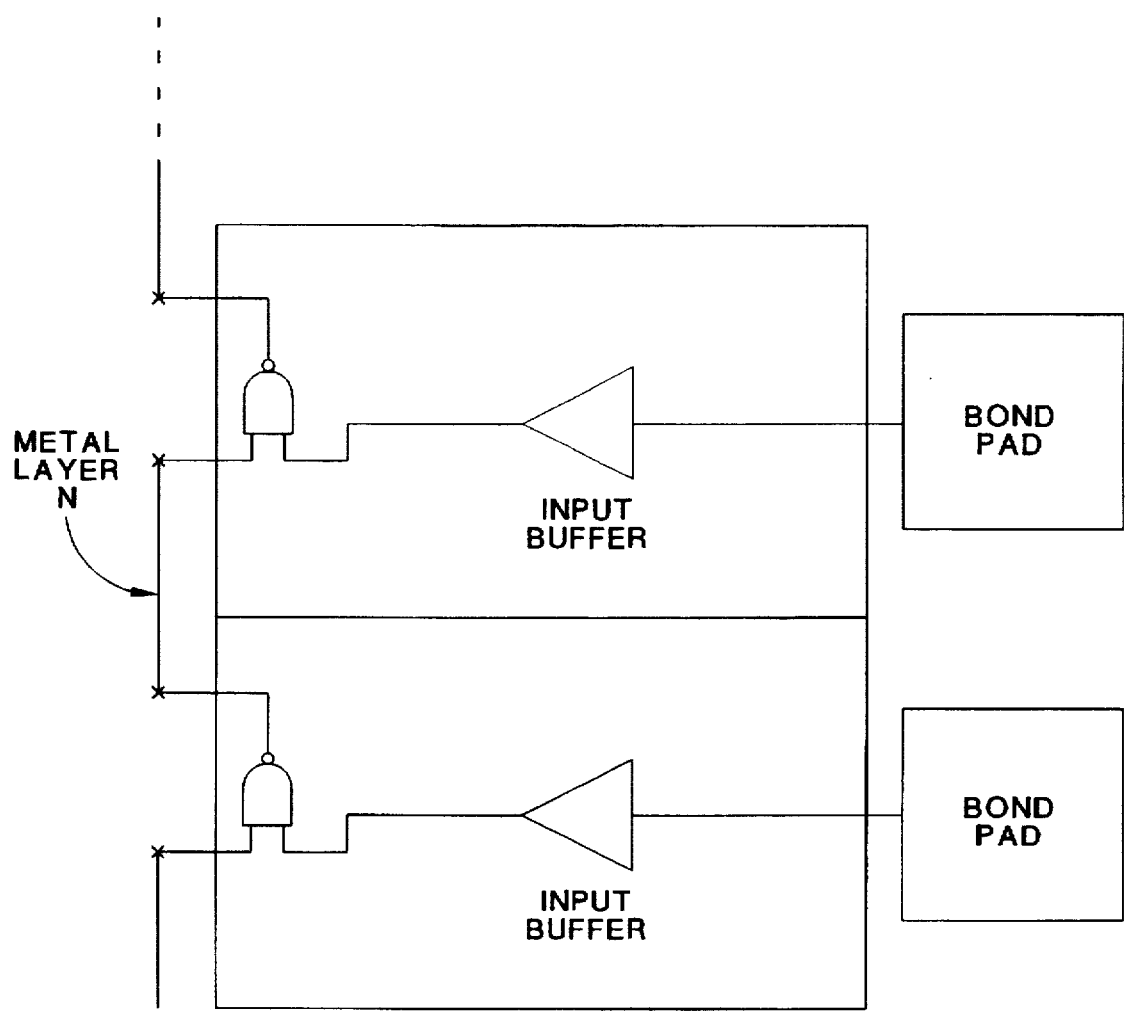
FIG. 3 is a schematic diagram of a circuit according to a further embodiment of the invention.

The above-described embodiment of the invention has been illustrated with respect to a rectangular chip having four metal layers. However, it will be appreciated that this is not limiting of the invention and as long as a separate circuit path is formed on each metal layer, the propagation delay is determinable for any number of metal layers. This is illustrated with respect to FIG. 3 which shows a schematic diagram of a circuit which is provided for each of n metal layers in an integrated circuit. Moreover, it will be understood that other logic gates such as NOR, OR, AND gates are useful in other embodiments of the invention and it is not necessary to have a bond pad corresponding to each gate.

What is claimed is:

1. A semiconductor device having a circuit for measuring propagation delay related to at least two metal layers on the device, the circuit comprising:

a first bond pad connected to an input of a first signal path, the first signal path comprising a first plurality of serially connected logic gates wherein the connection between each logic gate of the first plurality is formed on a first metal layer; and a second bond pad connected to an output of a second signal path, the second signal path comprising a second plurality of serially connected logic gates wherein the connection between each logic gate of the second plurality is formed on a second metal layer;

wherein the second signal path is in electrical communication with the first signal path such that the propagation delay attributable to the first metal layer is separately determinable from the propagation delay attributable to the second metal layer.

2. A semiconductor device as in claim 1 wherein the first and second pluralities of logic gates comprise NAND gates.

3. A semiconductor device as in claim 1 wherein the first and second pluralities of logic gates comprise NOR gates.

4. A semiconductor device as in claim 1 wherein the first and second pluralities of logic gates comprise inverters.

5. A semiconductor device as in claim 1 wherein each logic gate in the first and second pluralities of logic gates comprises an input which is electrically connected to a corresponding bond pad.

6. A semiconductor device as in claim 5 wherein the electrical connection between each logic gate and the corresponding bond pad comprises a buffer circuit.

* * * * *